United States Patent [19]

Marks et al.

[11] Patent Number: 5,120,238
[45] Date of Patent: Jun. 9, 1992

[54] LATCHING IC CONNECTOR

[75] Inventors: Richard L. Marks; Donald W. Milbrand, Jr., both of Mechanicsburg, Pa.

[73] Assignee: Wells Electronics, Inc., South Bend, Ind.

[21] Appl. No.: 670,741

[22] Filed: Mar. 15, 1991

[51] Int. Cl.⁵ .............................................. H01R 13/62
[52] U.S. Cl. ...................................... 439/331; 439/73
[58] Field of Search ................ 439/328–331, 439/71, 72, 73, 526, 525

[56] References Cited

U.S. PATENT DOCUMENTS

| | | | |
|---|---|---|---|
| 4,657,328 | 4/1987 | Matsuoka | 439/331 |
| 4,717,346 | 1/1988 | Yoshizaki | 439/331 |
| 4,940,432 | 7/1990 | Consoli et al. | 439/330 |
| 5,000,696 | 3/1991 | Matsuoka et al. | 439/331 |
| 5,009,608 | 4/1991 | Shipe | 439/73 |

Primary Examiner—Larry I. Schwartz
Assistant Examiner—Hien D. Vu
Attorney, Agent, or Firm—James D. Hall

[57] ABSTRACT

A connector for an integrated circuit (IC) to secure the IC during testing. The connector includes a unique latching system which includes an actuator and a hook which are pivotally connected in an over-center movement fashion to significantly increase the clamping force from the force applied to latch the actuator or a connected latch plate.

13 Claims, 6 Drawing Sheets

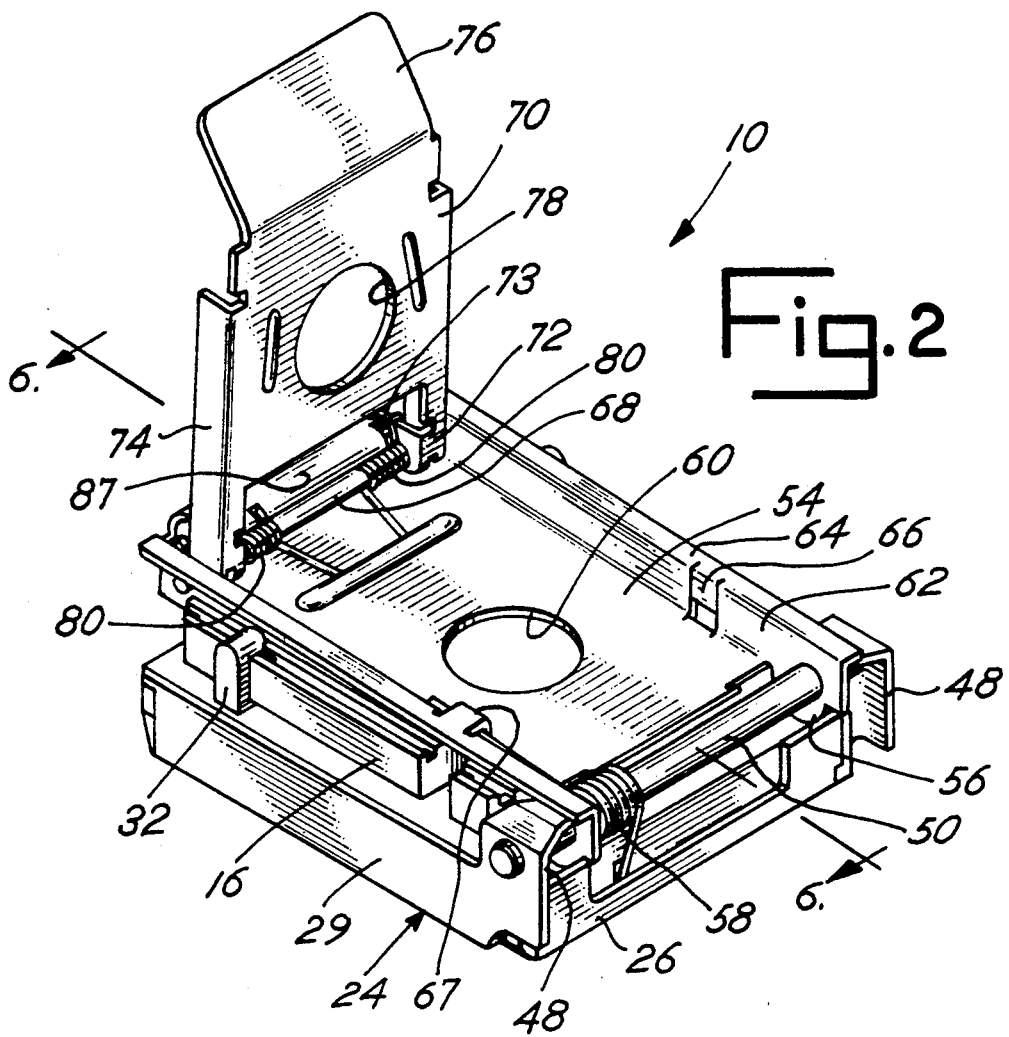
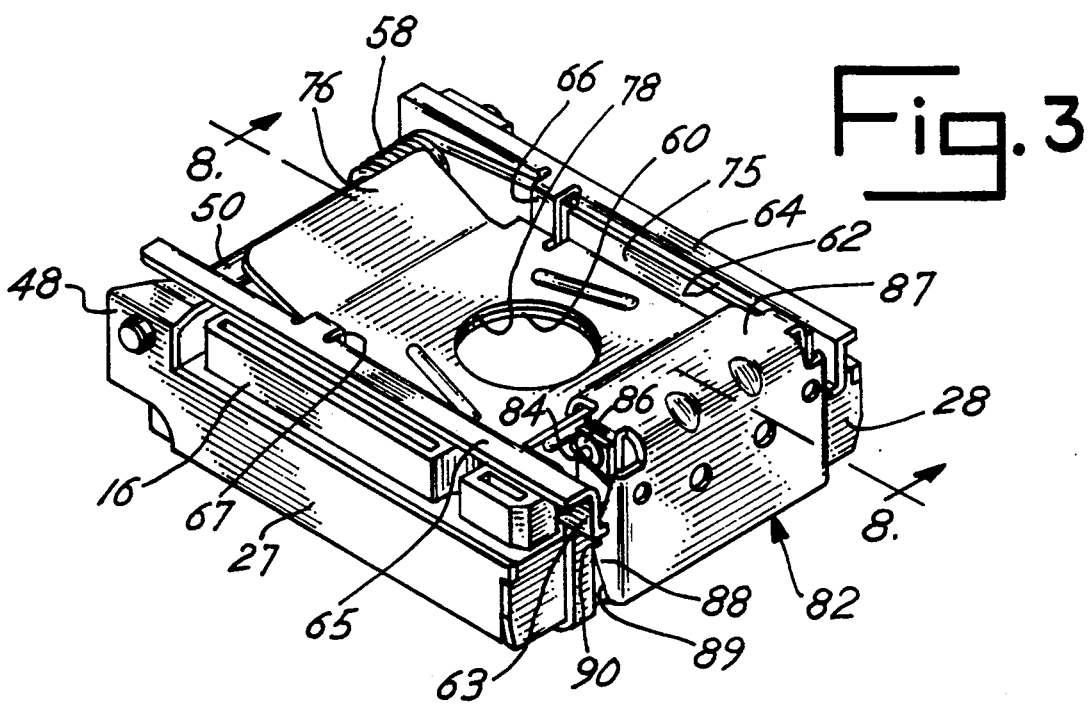

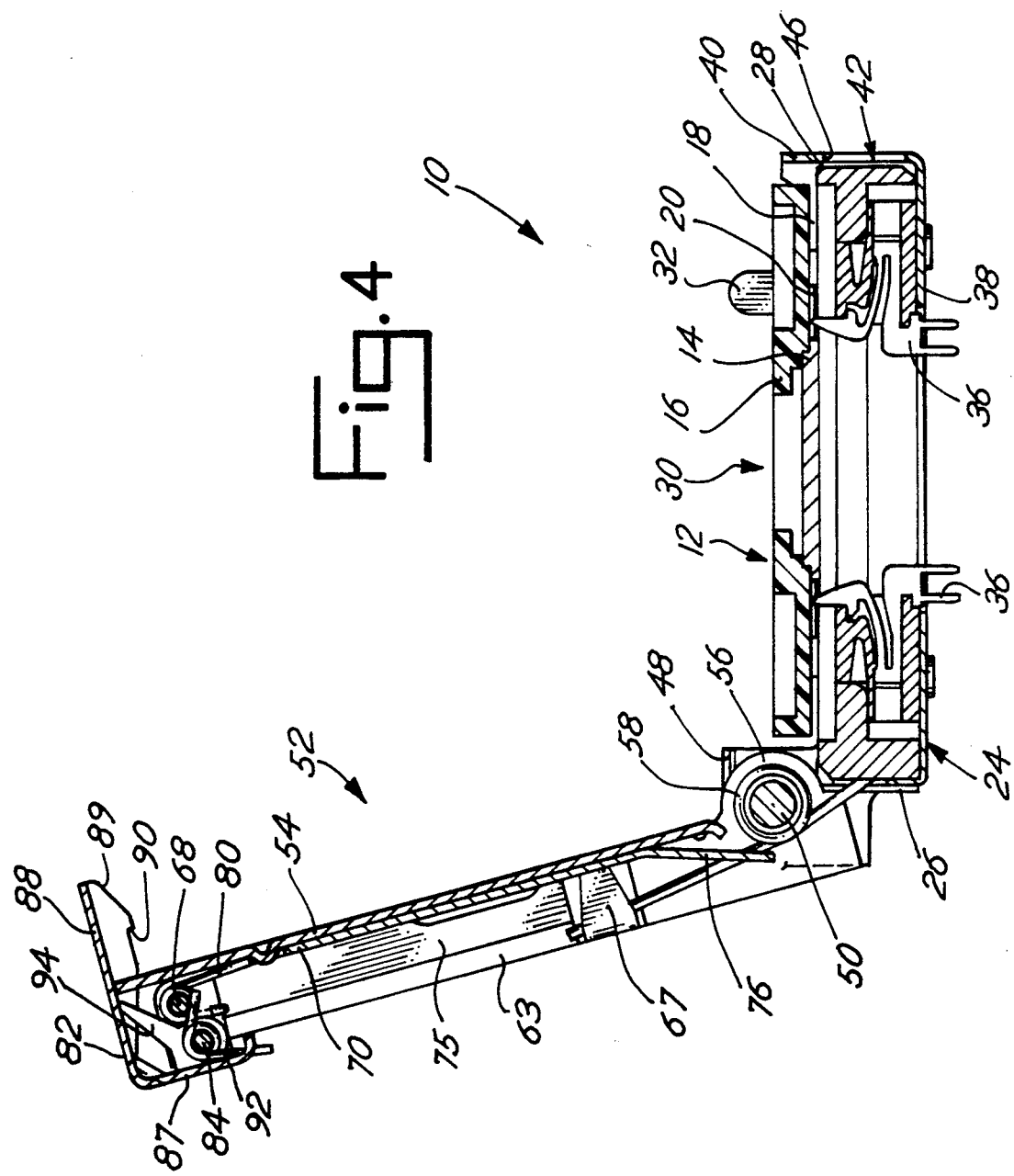

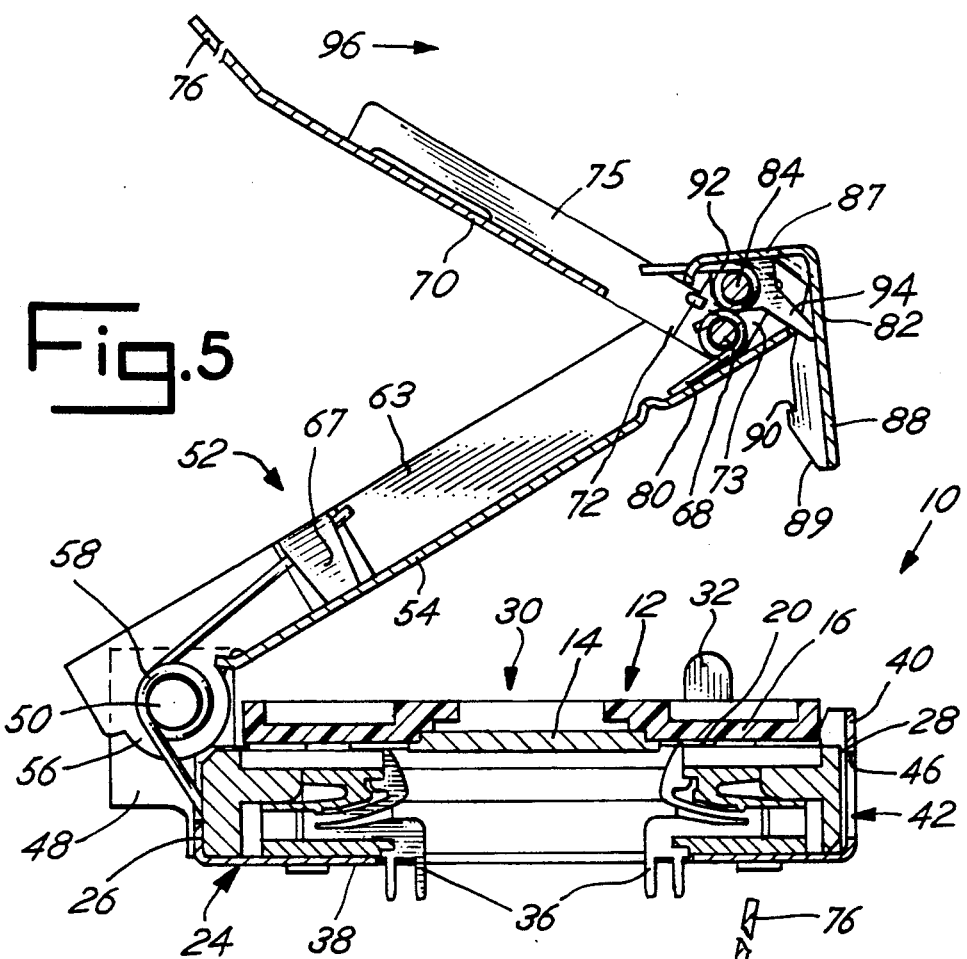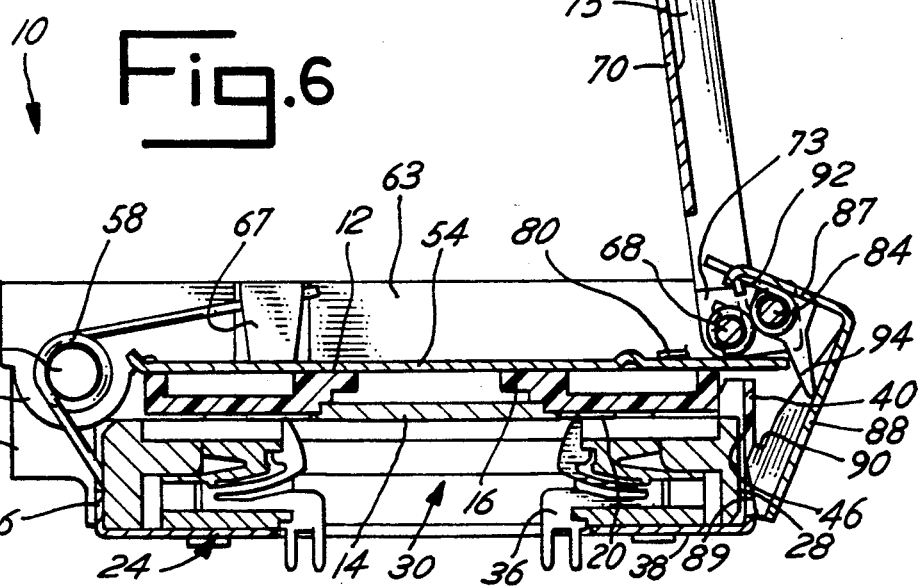

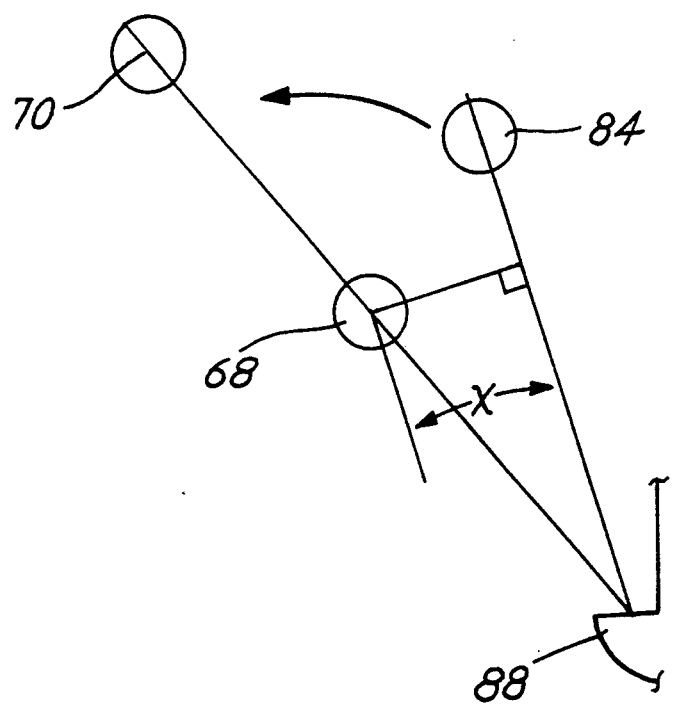

LATCHING IC CONNECTOR

SUMMARY OF THE INVENTION

This invention relates to integrated circuit (IC) chip connectors and will have application to a latching IC connector.

IC chip carriers and connectors typically house an IC during burn-in testing. For certain types of chip carriers, the connector must firmly and positively lock the carrier in place by an external mechanism. One example of a prior chip connector is shown in U.S. Pat. No. 4,502,747, which includes opposing hinged frames to lock the carrier into the connector.

The connector of this invention includes a latching mechanism which is pivotally connected to an end of the connector. The latching mechanism includes a latch plate and a hook part pivotally connected to an opposite end of the latch plate. An actuator is pivotally connected to the latch plate adjacent the hook part and, when depressed, serves to draw the hook part into locking contact with the connector body to secure the IC carrier within. Conductive leads extend from the connector to allow the connector to be mounted to a test board. The plate-actuator-hook connection allows the connector to be opened and closed with one hand, since the force transmitted to the hook part is significantly increased from the force applied to the actuator.

Accordingly, it is an object of this invention to provide for an IC connector which firmly secures the IC in place during testing.

Another object is to provide for an IC connector which may be latched and unlatched with one hand.

Another object is to provide for an IC connector which can accommodate leadless IC chips or IC chips with leads.

Another object is to provide for an IC connector which heightens the clamping force on the IC carrier from the force imparted to the latch actuator.

BRIEF DESCRIPTION OF THE DRAWINGS

A preferred embodiment of the invention has been depicted for illustrative purpose wherein:

FIG. 2 is a perspective view of the IC connector with the carrier inserted and the latch in a partially closed position.

FIG. 3 is a perspective view similar to FIG. 2, but showing the latch in a fully closed position.

FIG. 4 is a sectional view of the connector with the latch in a full open position.

FIGS. 5-8 are sectional views of the connector showing in sequence the shifting of the latch from the open position of FIG. 4 through the fully closed position of FIG. 8.

FIG. 9 is a schematic representation of the moment created by the over-center latches.

DESCRIPTION OF THE PREFERRED EMBODIMENT

Figure 1:
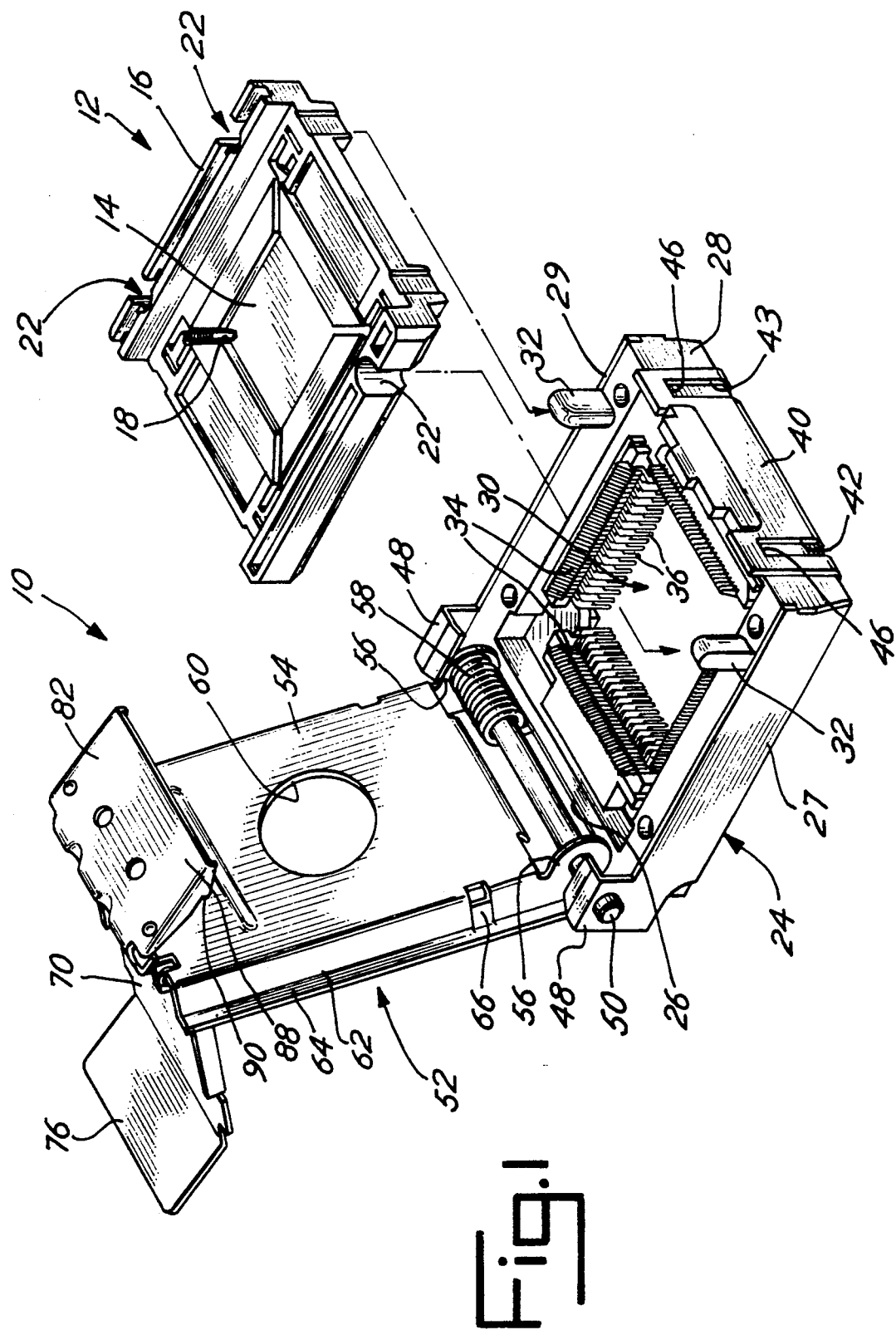
FIG. 1 is a perspective view of the IC connector of this invention with an IC carrier shown just prior to insertion.

The preferred embodiment herein described is not intended to be exhaustive or to limit the invention to the precise form disclosed. It is chosen and described to illustrate the principles of the invention and its application and practical use to enable others skilled in the art to practice its teachings.

Referring now to the drawings, reference numeral 10 generally designates the IC chip connector of this invention. Reference numeral 12 generally designates the chip carrier shown in the drawings, which for illustrative purposes, is shown as a typical single piece quadpack carrier for leaded IC chip 14. Carrier 12 is shown in U.S. Pat. No. 4,435,724, incorporated herein by reference, and includes body 16 and tabs 18 which hold the IC 14 in place for testing. Grooves (not shown) are defined in body 16 to accommodate IC leads 20 (FIGS. 4-8). Slots 22 are defined in body 16 to allow for firm connection to connector 10.

Connector 10 includes a body 24 which is defined by side walls 26, 27, 28, 29 and a central opening 30. Posts 32 extend upwardly from walls 27, 29 to accommodate carrier slots 22 as shown in FIGS. 2 and 3. Body 24 defines grooves 34 facing center opening 80 as shown to accommodate leads 20 of chip 14. Leads 36 extend from grooves 84 to below the bottom surface 38 of body 24 for electrical connection to a PC board (not shown). Leads 20 and leads 86 are in electrical contact when the IC 14 and carrier 12 are secured to the connector to insure proper testing conditions.

It should be noted that the configuration of carrier 12 and the orientation of grooves 84 will depend on the configuration and leads of IC 14. The configuration and orientation illustrated does not limit the invention to those designs but is shown for purposes of description only.

Side wall 28 of connector 10 includes a catch plate 40 which defines spaced slots 42 43 as shown. Each slot 42, 43 defines an upper lip 46. Opposite side wall 26 of connector 10 includes raised tabs 48. A rod 50 extends through tabs 48 and is secured stationary relative to connector 10.

Latching mechanism 52 shown in FIGS. 1-3 includes latch plate 54 which has ears 56 through which rod 50 extend as shown in FIG. 1. Helical spring 58 acts to force the rotative movement of the plate 54 about rod 50. Plate 54 has a vent hole 60 aligned with connector center opening 30 when the plate is in a latched position (FIG. 3). Plate 54 also includes raised side walls 62, 63 and top lips 64, 65. Lips 64, 65 each include opposed extensions 66, 67 which project towards the center of plate 54, with an end of spring 58 housed in the space between the extension 67 and side wall 62.

A rod 68 is connected between and spans plate walls 62, 63. Actuator plate 70 is rotatably connected to rod 68 as shown in FIG. 2. Actuator 70, as shown in FIG. 2, includes legs 72 which have feet 73 through which rod 68 extends and oppositely located side flanges 74, 75 which bear against extensions 66, 67 to secure the actuator and plate 54 in the latched position of FIG. 3. Actuator 70 also includes inclined handle part 76 to facilitate use and a vent hole 78 which is aligned with vent hole 60 of plate 54. Springs 80 force rotative movement of actuator 70 relative to plate 54 and connector 10.

Latch hook part 82 is rotatably connected to actuator plate 70 through a rod 84 which spans actuator feet 73 and is secured thereto by retainer ring 86. Hook part 82 includes a one-piece upper portion 87 which overlies rod 84 and a depending lower hook portion 88 which includes side located peripheral hooks 90 (one shown). Spring 92 which is connected to rod 84 and bears on rod 68 biases hook part 82 in a latched position.

As actuator plate 70 rotates about rod 68, projection 94 of hook part 82 contacts plate 54 which serves to urge hook part 82 into an unlatched or loading position as shown in FIG. 5.

FIGS. 4-8 show the connector 10 through a series of sectional views of its securing operations. FIG. 4 illustrates the connector 10 with latching mechanism 52 in a full open position which allows the carrier 12 (with IC 14) to be placed in the connector such that IC leads 20 contact connector leads 36 as shown. Latching mechanism 52 is then pivoted as shown in FIGS. 5-8 to secure the carrier 12 for testing.

Normally, connector 10 will be secured to a PC board (not shown) before latching mechanism 52 is closed. This will allow one handed operation of the latching mechanism 52. In FIG. 5, a user (not shown) grasps actuator handle 76 and pushes in the direction of arrow 96. This action causes latch plate 54 to pivot about rod 50. As hook part 82 is lowered, the projection 94 of hook portion 88 contacts plate 54 urging the hook part 90 to position in slots 42, 43 of catch plate 40.

Figure 7:
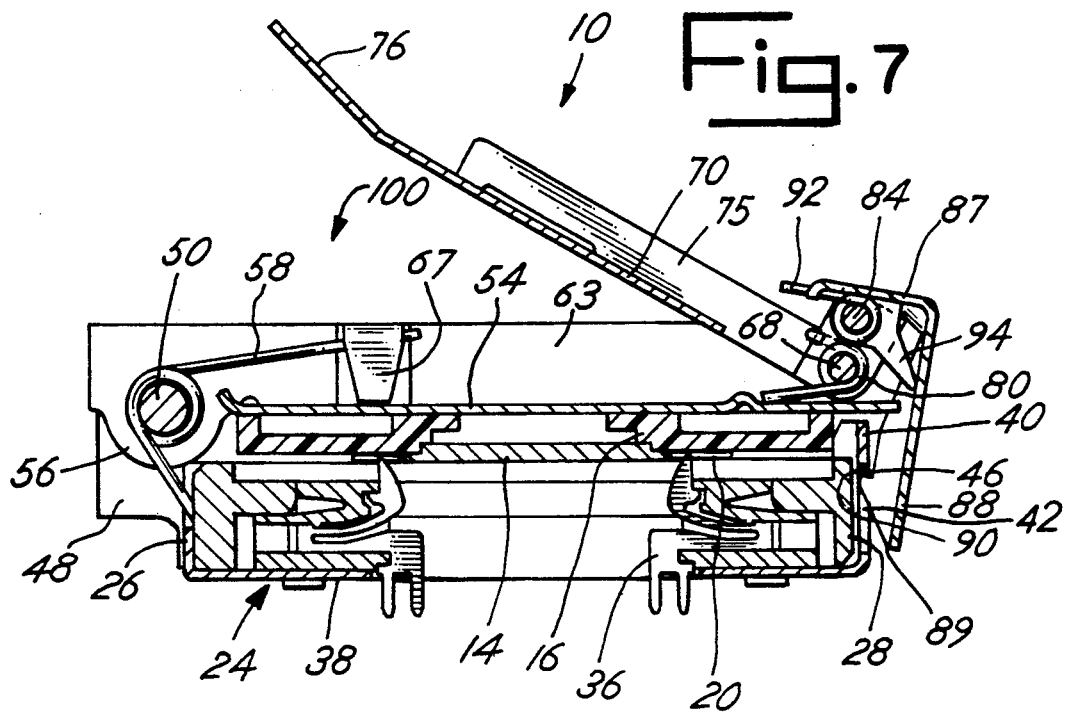
Figure 8:
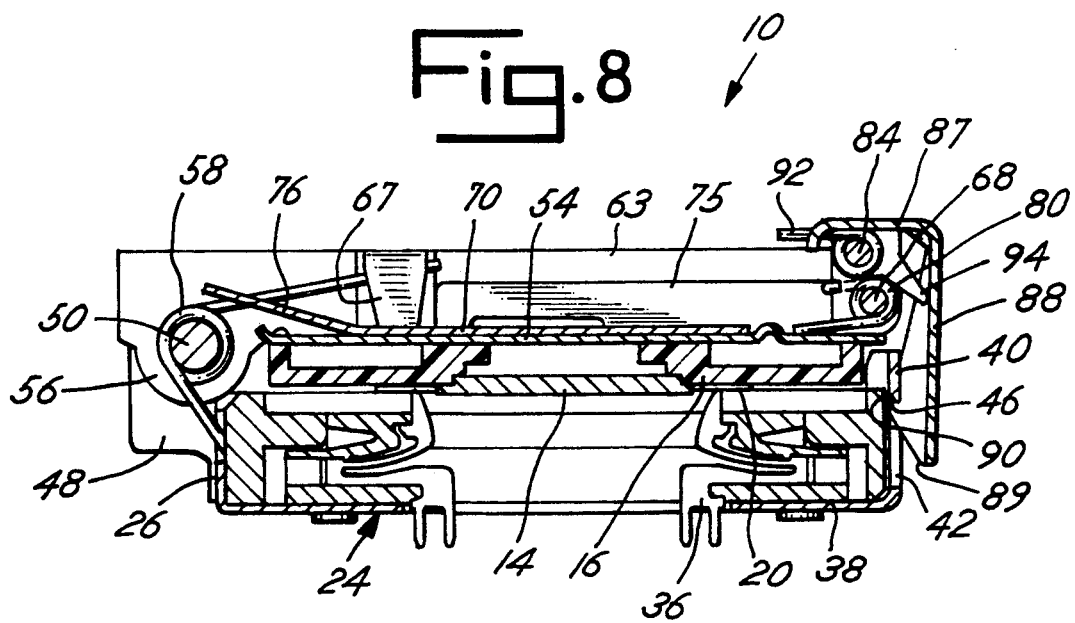

Actuator 70 is then pivoted about rod 68 to properly position the hook part 82 as shown in FIG. 6. The user then pulls actuator handle 76 in the direction of arrow 100 (FIG. 7). This action pulls rod 84 and its connected hook part forward, towards rod 50 and over the center axis of the rod 68. This over-center pivoting creates a moment which is related to the ratio of the distance between the centerline of rod 68 to the end of plate 70 over the diminishing angle X as shown in FIG. 9. In the embodiment shown this ratio is approximately 18 to 1 and the force transferred from handle 76 through rods 68, 84 to hook part 82 is greater than 200:1. Any workable ratio greater than 1:1 may be used. As the user continues to pivot actuator 70, the actuator is secured in a snap-fit manner between side wall 62, 63 by extensions 66, 67. Due to the over-center arrangement of rods 50, 68 and 84, a user need exert only about 4 ounces of force on actuator 70 to exert a clamping force of about 75 pounds on IC carrier 12.

To disengage latch mechanism 52, the reverse of the above procedure is followed. With the latch 62 in the locked position of FIG. 8, the user pulls up on actuator plate handle 76. This causes rod 84 to shift away from rod 50 urging rod 84 over the center axis of rod 68. Projection 94 then rides on plate 54 forcing hook part 88 to move away from rod 50. When hook portion 88 disengages from slots 42, 43 the latching mechanism 52 may be pivoted into the open position. The carrier 14 may then be removed from connector 10 and a new carrier inserted for IC testing.

It is understood that the above description does not limit the invention to the details given, but may be modified within the scope of the following claims.

We claim:

1. A connector for securing an integrated circuit during testing operations, said connector including a body defining a central cavity means for accepting an integrated circuit, and latching means for securing said integrated circuit to said body, means carried by said body in contact with leads of said integrated circuit for electrically coupling the integrated circuit to a power test source, the improvement wherein said latching means includes a hook part, an actuator pivotally connected to said hook part, said actuator and hook part connected for correlative movement between a latched position with the hook part contacting said body and the actuator covering said integrated circuit, and an unlatched position with the actuator and hook part spaced from said body, first biasing means connected to said hook part for continually urging the hook part toward its said unlatched position.

2. The connector of claim 1 wherein said connector includes a catch plate fastened to said connector body, said catch plate defining a slot therein terminating in a lip, said hook part including a latch hook part contacting said lip when the hook part is in its said latched position.

3. The connector of claim 1 and further including a latch plate pivotally connected to said body at one end thereof, said actuator pivotally connected to an end of said latch plate opposite said one end whereby the latch plate is shiftable with said actuator between latched and unlatched positions, said latch plate adjacently overlying and securing said integrated circuit in said body when the actuator and latch plate are in the latched position.

4. The connector of claim 2 wherein said hook part includes a rod spanning said actuator transverse to a direction of pivoting movement, said actuator including a rod spanning said latch plate and positioned adjacent to and substantially parallel with said hook part rod, wherein pivoting of the actuator towards its said latched position causes said actuator rod to slide towards said hook part while bearing on said latch plate, and simultaneously draws said hook part rod over a central axis of the actuator rod to increase clamping force on said hook part.

5. The connector of claim 3 and second biasing means connected to said actuator for urging the actuator towards its unlatched position, and means connected to said latch plate for securing said actuator and hook part in their said latched positions.

6. The connector of claim 3 and third biasing means connected to said latch plate for urging the latch plate towards its said unlatched position.

7. The connector of claim 6 wherein said means for securing including a wall, an extension projecting from said latch plate well said actuator contacting said extension as the actuator is pivoted into its latched position wherein said actuator is frictionally secured to the latch plate.

8. The connector of claim 7 wherein said extension defines a gap between said wall and said extension, said third biasing means having a terminal end fitted in said gap.

9. A connector for carrying an integrated circuit during test operations, said connector comprising a body defining a central cavity to accommodate an integrated circuit, lead means extending from said body to and contacting said integrated circuit for electrically coupling said integrated circuit to a source of electricity, latching means for securing said integrated circuit in said cavity, said latching means including an actuator plate pivotally connected at one end thereof to said connector adjacent one end of the connector, and a hook part pivotally connected to said actuator plate adjacent said plate one end, said actuator plate pivotable between a latched position overlying said integrated circuit, and an unlatched position spaced from said connector, said hook part moving correlatively with said actuator plate and constituting clamp means for contacting said connector body to secure the actuator plate in its said latched position, first biasing means connected to said hook part for continually urging the hook part towards its said unlatched position.

10. The connector of claim 9 and further including a latch plate pivotally connected to said body at one end thereof, said actuator pivotally connected to an end of said latch plate opposite said one end whereby the latch plate is shiftable with said actuator between latched and unlatched positions, said latch plate adjacently overlying and securing said integrated circuit in said body when the actuator and latch plate are in the latched position.

11. The connector of claim 10 wherein said hook part includes a rod spanning said actuator transverse to a direction of pivoting movement, said actuator including a rod spanning said latch plate and positioned adjacent to and substantially parallel with said hook part rod, wherein pivoting of the actuator towards its said latch position causes said actuator rod to slide towards said hook part while bearing on said latch plate, and simultaneously draws said hook part rod over a central axis of the actuator rod to increase clamping force on said hook part.

12. The connector of claim 10 and second biasing means connected to said actuator for urging the actuator towards its unlatched position, and means connected to said latch plate for securing said actuator and hook part in their said latched positions.

13. The connector of claim 11 and third biasing means connected to said latch plate for urging the latch plate towards its said unlatched position.

* * * * *